United States Patent
Uneme et al.

(10) Patent No.: US 12,244,124 B2
(45) Date of Patent: Mar. 4, 2025

(54) ROTARY ELECTRIC DRIVE UNIT

(71) Applicant: HONDA MOTOR CO., LTD., Tokyo (JP)

(72) Inventors: Takahiro Uneme, Tokyo (JP); Masaki Takahashi, Tokyo (JP); Ryuta Wakabayashi, Tokyo (JP); Takahiro Kozeki, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 361 days.

(21) Appl. No.: 17/807,867

(22) Filed: Jun. 21, 2022

(65) Prior Publication Data
US 2023/0022138 A1     Jan. 26, 2023

(30) Foreign Application Priority Data

Jul. 26, 2021   (JP) ................... 2021-121467

(51) Int. Cl.
| | |
|---|---|
| *H02B 1/06* | (2006.01) |
| *B60K 1/02* | (2006.01) |
| *B60R 16/023* | (2006.01) |
| *H05K 7/14* | (2006.01) |

(52) U.S. Cl.
CPC ............ *H02B 1/06* (2013.01); *B60K 1/02* (2013.01); *B60R 16/0238* (2013.01); *H05K 7/1452* (2013.01); *B60Y 2410/115* (2013.01)

(58) Field of Classification Search
None
See application file for complete search history.

(56) References Cited

U.S. PATENT DOCUMENTS

| | | | | |
|---|---|---|---|---|
| 6,166,498 | A  * | 12/2000 | Yamaguchi | B60L 15/007 |
| | | | | 903/910 |
| 2009/0251018 | A1* | 10/2009 | Koshida | H02K 5/225 |
| | | | | 310/71 |
| 2020/0238930 | A1 | 7/2020 | Yamanaka et al. | |
| 2022/0190675 | A1* | 6/2022 | Uneme | H02K 5/225 |

FOREIGN PATENT DOCUMENTS

JP        2019034621 A        3/2019

* cited by examiner

*Primary Examiner* — Oscar C Jimenez
(74) *Attorney, Agent, or Firm* — CKC & Partners Co., LLC

(57) ABSTRACT

An electrical connection structure includes a case in which a first electric motor and a second electric motor are housed, and electrical equipment that controls the first electric motor or the second electric motor. The first electric motor is electrically connected to a first three-phase terminal of the electrical equipment via a connecting member. The second electric motor is electrically connected to a second three-phase terminal of the electrical equipment via the connecting member. On the electrical equipment side, the first three-phase terminal and the second three-phase terminal are arranged in series. On the case side, a first electric motor side three-phase terminal, which is connected to the first electric motor, in the connecting member, and a second electric motor side three-phase terminal, which is connected to the second electric motor, in the connecting member, are arranged in parallel.

3 Claims, 2 Drawing Sheets

ROTARY ELECTRIC DRIVE UNIT

This application is based on and claims the benefit of priority from Japanese Patent Application No. 2021-121467, filed on 26 Jul. 2021, the content of which is incorporated herein by reference.

BACKGROUND OF THE INVENTION

Field of the Invention

The present invention relates to an electrical connection structure between an electric motor and electrical equipment that controls the electric motor.

Related Art

Conventionally, in a rotary electric drive unit in which electrical equipment is mounted on a case in which an electric motor is housed in a hybrid vehicle, three-phase connectors provided on an electrical equipment side are connected to three-phase connectors provided on a case side to electrically connect the electrical equipment to the electric motor. In this case, the three-phase connector provided in the forward portion of the electrical equipment side is connected to the three-phase connector provided in the forward portion of the case side, and the three-phase connector provided in the rearward portion of the electrical equipment side is connected to the three-phase connector provided in the rearward portion of the case side. In the configuration in which the three-phase connector provided in the rearward portion of the electrical equipment side is connected to the three-phase connector provided in the rearward portion of the case side in this way, the case protrudes rearward, and the size of the case increases rearward.

Therefore, as disclosed in Patent Document 1 below, a structure in which one end of a power cable is connected to a connector connected to a side surface of a power controller and the other end of the power cable is connected to a transaxle in the forward portion of the rotary electric drive unit is conceivable. Thus, the connecting portions between the motor, which is an electric motor, and the power controller are grouped in the forward portion of the rotary electric drive unit, so that the above-described issue can be solved.

Patent Document 1: Japanese Unexamined Patent Application, Publication No. 2019-34621

SUMMARY OF THE INVENTION

However, in the configuration disclosed in Patent Document 1, since the connecting portions between the electric motor and the power controller are grouped in the forward portion, the transaxle protrudes forward and the size of the case increases forward. This could result in significant force being applied to the transaxle in the event of a vehicle collision. To solve the above issue, it is conceivable that the connecting portions between the electric motor and the power controller are distributed to the left and right sides of the rotary electric drive unit, but in this case, the size of the rotary electric drive unit in the left-right direction is increased. This affects the layout of the rotary electric drive unit and peripheral components in the engine room when the rotary electric drive unit is placed in the engine room.

An object of the present invention is to provide an electrical connection structure capable of realizing a rotary electric drive unit having a compact configuration.

(1) A first aspect of the present invention provides an electrical connection structure including a case in which a first electric motor and a second electric motor are housed, and electrical equipment that controls the first electric motor or the second electric motor. The first electric motor is electrically connected to a first three-phase terminal of the electrical equipment via a connecting member. The second electric motor is electrically connected to a second three-phase terminal of the electrical equipment via the connecting member. On a side of the electrical equipment, the first three-phase terminal and the second three-phase terminal are arranged in series. On a side of the case, a first electric motor side three-phase terminal, which is connected to the first electric motor, in the connecting member, and a second electric motor side three-phase terminal, which is connected to the second electric motor, in the connecting member, are arranged in parallel.

(2) In a second aspect of the present invention according to the first aspect, it is preferable that a rotation shaft of the first electric motor and a rotation shaft of the second electric motor are positioned in parallel with each other in the case. It is preferable that a virtual line connecting the rotation shaft of the first electric motor and the rotation shaft of the second electric motor is not parallel to a virtual line passing through centers of the first three-phase terminal and the second three-phase terminal arranged in series.

(3) In a third aspect of the present invention according to the first or second aspect, it is preferable that the connecting member includes: an electrical equipment side coupling member electrically connected to the first three-phase terminal and the second three-phase terminal; an electric motor side coupling member including the first electric motor side three-phase terminal and the second electric motor side three-phase terminal; and a conversion part electrically connecting the first three-phase terminal and the second three-phase terminal arranged in series, to the first electric motor side three-phase terminal and the second electric motor side three-phase terminal arranged in parallel. It is preferable that a length of the electrical equipment side coupling member in a direction in which the first three-phase terminal and the second three-phase terminal are arranged is longer than a length of the electric motor side coupling member in the same direction as the direction.

(4) In a fourth aspect of the present invention according to the third aspect, the electrical equipment side coupling member is preferably provided in the electrical equipment. The conversion part and the electric motor side coupling member are preferably provided in the case. A floating mechanism is preferably provided between the electrical equipment side coupling member and the first three-phase terminal and the second three-phase terminal.

According to the present invention, it is possible to provide an electrical connection structure capable of realizing a rotary electric drive unit having a compact configuration.

DETAILED DESCRIPTION OF THE INVENTION

A specific embodiment of the present invention will be described in detail below with reference to the drawings.

Figure 1:
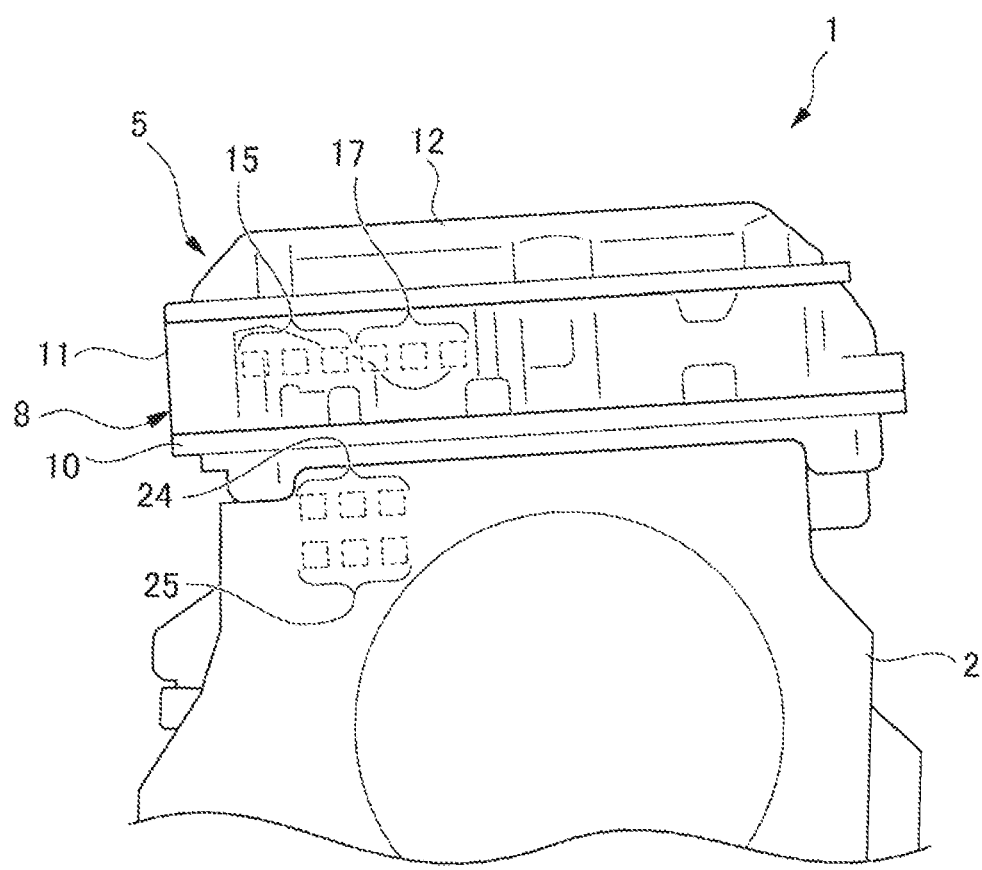
FIG. 1 is a side view showing an example of a rotary electric drive unit to which an electrical connection structure according to an embodiment of the present invention is applied.
Figure 2:
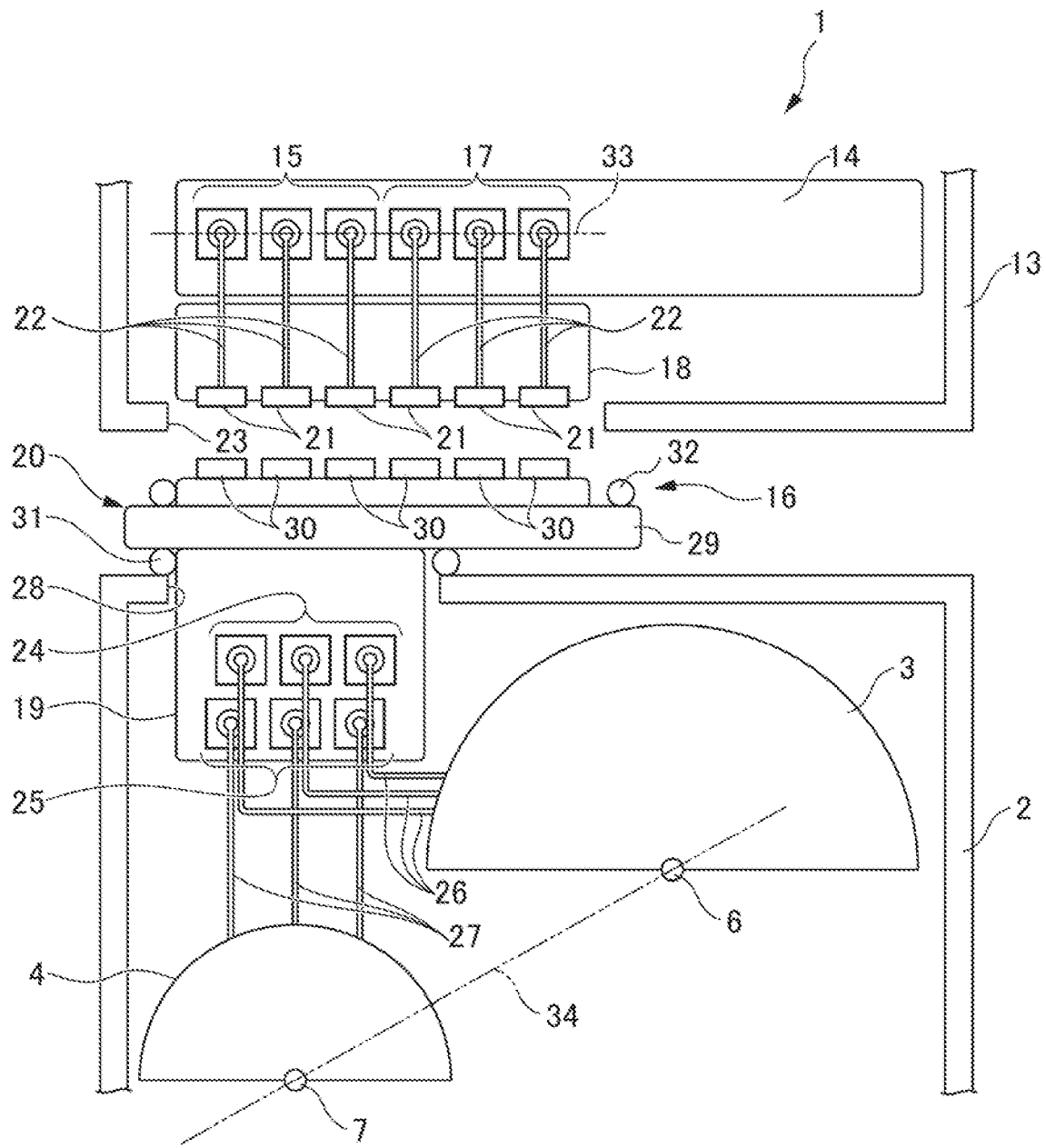
FIG. 2 is a schematic configuration diagram showing the electrical connection structure according to the embodiment of the present invention.

FIG. 1 is a right side view showing an example of a rotary electric drive unit to which an electrical connection structure according to an embodiment of the present invention is applied. FIG. 2 is a schematic configuration diagram showing the electrical connection structure according to the embodiment of the present invention. FIG. 2 shows an exploded state of the electrical connection structure. A rotary electric drive unit 1 of the present embodiment includes a first electric motor 3 and a second electric motor 4, which are housed in a case 2, and electrical equipment 5 mounted on the case 2.

The first electric motor 3 is a motor for driving a vehicle to travel and generates a rotational driving force with electric power supplied from a battery. As shown in FIG. 2, the first electric motor 3 is disposed at an upper end portion of the rear side of the case 2 with a rotation shaft 6 along the left-right direction.

The second electric motor 4 is a motor for power generation and generates electric power with a rotational drive force applied to a rotation shaft 7. As shown in FIG. 2, the second electric motor 4 is disposed in a forward part of the case 2 with the rotation shaft 7 along the left-right direction. The second electric motor 4 is disposed in the case 2 so that the rotation shaft 7 is positioned lower and forward relative to the rotation shaft 6 of the first electric motor 3.

As described above, the rotation shaft 6 of the first electric motor 3 and the rotation shaft 7 of the second electric motor 4 are arranged along the left-right direction. As described above, the rotation shaft 7 of the second electric motor 4 is positioned lower and forward relative to the rotation shaft 6 of the first electric motor 3. Therefore, in the case 2, the rotation shaft 6 of the first electric motor 3 and the rotation shaft 7 of the second electric motor 4 are positioned in parallel with each other in a state of being spaced apart from each other in the upper-lower and left-right directions.

The electrical equipment 5 is mounted on the case 2. The electrical equipment 5 includes a power control unit (PCU) 8.

As shown in FIG. 1, the PCU 8 is disposed directly above the case 2. The PCU 8 includes PCU cases 10 and 11 and a PCU cover 12. Specifically, the PCU case 11 is disposed above the PCU case 10, and the PCU cover 12 is disposed above the PCU case 11. A power module 14 is disposed in a housing 13 formed by the PCU cases 10 and 11 and the PCU cover 12. That is, the PCU 8 includes the power module 14 housed in the housing 13.

The electrical connection structure of the present embodiment is applied to the rotary electric drive unit 1 configured as described above. The electrical connection structure of the present embodiment includes a case 2 in which a first electric motor 3 and a second electric motor 4 are housed, and electrical equipment 5 that controls the first electric motor 3 or the second electric motor 4. In this electrical connection structure, the first electric motor 3 is electrically connected to a first three-phase terminal 15 of the electrical equipment 5 via a connecting member 16, and the second electric motor 4 is electrically connected to a second three-phase terminal 17 of the electrical equipment 5 via the connecting member 16. As shown in FIG. 2, the connecting member 16 includes an electrical equipment side coupling member 18, an electric motor side coupling member 19, and a conversion part 20.

The electrical equipment side coupling member 18 is a connector, and includes six electrical equipment side electrical connecting parts 21 electrically connecting the conversion part 20 to the electrical equipment side coupling member 18. The six electrical equipment side electrical connecting parts 21 are arranged in series. Specifically, the six electrical equipment side electrical connecting parts 21 are arranged in a row along the forward-rearward direction. The electrical equipment side electrical connecting parts 21 are electrically connected to the first three-phase terminal 15 of the electrical equipment 5 and the second three-phase terminal 17 of the electrical equipment 5.

The first three-phase terminal 15 and the second three-phase terminal 17 are arranged in the power module 14 of the electrical equipment 5. The first three-phase terminal 15 and the second three-phase terminal 17 are arranged in series on the electrical equipment 5 side. Specifically, the three terminals of the first three-phase terminal 15 and the three terminals of the second three-phase terminal 17 are arranged in a row in the forward-rearward direction. The three terminals of the first three-phase terminal 15 and the three terminals of the second three-phase terminal 17 are electrically connected to the six electrical equipment side electrical connecting parts 21 by connecting wire parts 22, respectively.

In the present embodiment, a floating mechanism is provided between the electrical equipment side coupling member 18 and the first three-phase terminal 15 and the second three-phase terminal 17, that is, between the electrical equipment side coupling member 18 and the first and second three-phase terminals 15, 17. The floating mechanism absorbs variation in tolerance between the electrical equipment side coupling member 18 and the electric motor side coupling member 19. Therefore, in the floating mechanism, electrical connections are made with wires rather than simple busbars.

The electrical equipment side coupling member 18 having such a configuration is provided in the electrical equipment 5. Specifically, the electrical equipment side coupling member 18 is provided within the housing 13. At this time, the electrical equipment side coupling member 18 is provided within the housing 13 so as to correspond to an opening 23 formed in a forward part of the lower end portion of the housing 13. That is, the electrical equipment side coupling member 18 is disposed in a forward part of the lower end portion of the housing 13.

The electric motor side coupling member 19 is a connector, and includes a first electric motor side three-phase terminal 24 connected to the first electric motor 3 and a second electric motor side three-phase terminal 25 connected to the second electric motor 4. The first electric motor side three-phase terminal 24 and the second electric motor side three-phase terminal 25 are arranged in parallel. Specifically, the three terminals of the first electric motor side three-phase terminal 24 are arranged in series in a row in the forward-rearward direction, the three terminals of the second electric motor side three-phase terminal 25 are arranged in series in a row in the forward-rearward direction, and the three terminals of the first electric motor side three-phase terminal 24 arranged in series and the three terminals of the second electric motor side three-phase terminal 25 arranged in series are arranged in parallel.

The first electric motor side three-phase terminal 24 is electrically connected to the first electric motor 3. Specifically, each of the three terminals of the first electric motor side three-phase terminal 24 is electrically connected to each of coils of the first electric motor 3 by a first connecting wire part 26. The second electric motor side three-phase terminal 25 is electrically connected to the second electric motor 4. Specifically, each of the three terminals of the second electric motor side three-phase terminal 25 is electrically connected to each of coils of the second electric motor 4 by a second connecting wire part 27.

The electric motor side coupling member 19 having such a configuration is provided in the case 2. Specifically, the electric motor side coupling member 19 is disposed within the case 2 so as to correspond to an opening 28 formed in a forward part of the upper end portion of the case 2. That is, the electric motor side coupling member 19 is disposed in the forward end portion of the upper end portion within the case 2. The electric motor side coupling member 19 disposed within the case 2 is positioned in front of the first electric motor 3 and above the second electric motor 4. Thus, in the present embodiment, on the case 2 side, the first electric motor side three-phase terminal 24, which is connected to the first electric motor 3, in the connecting member 16 and the second electric motor side three-phase terminal 25, which is connected to the second electric motor 4, in the connecting member 16 are arranged in parallel.

The conversion part 20 includes a conversion part body 29 and six electric motor side electrical connecting parts 30 provided to the conversion part body 29. The six electric motor side electrical connecting parts 30 are provided at the upper end portion of the conversion part body 29 in a state of being exposed outward from the conversion part body 29. The six electric motor side electrical connecting parts 30 are arranged in series. Specifically, the six electric motor side electrical connecting parts 30 are arranged in a row along the forward-rearward direction.

The electric motor side electrical connecting parts 30 are electrically connected to the electrical equipment side electrical connecting parts 21. Specifically, the electric motor side electrical connecting parts 30 are directly connected to the electrical equipment side electrical connecting parts 21 without interposing connecting wire parts or the like. The electric motor side electrical connecting parts 30 are electrically connected to the first electric motor side three-phase terminal 24 and the second electric motor side three-phase terminal 25. Specifically, the three terminals of the first electric motor side three-phase terminal 24 and the three terminals of the second electric motor side three-phase terminal 25 are electrically connected to the six electric motor side electrical connecting parts 30 by connecting wire parts (not shown), respectively.

In this way, the electrical equipment side coupling member 18 is electrically connected to the electric motor side coupling member 19 via the conversion part 20. Thus, the first three-phase terminal 15 and the second three-phase terminal 17 arranged in series are electrically connected to the first electric motor side three-phase terminal 24 and the second electric motor side three-phase terminal 25 arranged in parallel by the conversion part 20.

As shown in FIG. 2, in the present embodiment, the conversion part 20 is provided at the upper end portion of the case 2. Specifically, the conversion part body 29 is provided at the upper end portion of the case 2 so as to close the opening 28 of the case 2 in a state where the electric motor side electrical connecting parts 30 are positioned above the conversion part body 29. At this time, the gap between the conversion part 20 and the case 2 is sealed by a packing 31. The packing 31 is provided at a position surrounding the opening 28 of the case 2.

As shown in FIG. 2, when the electrical equipment 5 is mounted on the case 2, the housing 13 is placed on and fixed to the case 2. At this time, the electrical equipment side electrical connecting parts 21 of the electrical equipment side coupling member 18 are directly connected to the electric motor side electrical connecting parts 30 of the conversion part 20. In a state where the housing 13 is fixed to the case 2, the gap between the conversion part 20 and the housing 13 is sealed by a packing 32. The packing 32 is provided at a position surrounding the opening 23 of the housing 13. In the present embodiment, the length of the opening 28 of the case 2 in the forward-rearward direction is shorter than the length of the opening 23 of the housing 13 in the forward-rearward direction. Accordingly, the distance between the forward end portion and the rearward end portion of the packing 31 sealing the gap between the conversion part 20 and the case 2 is shorter than the distance between the forward end portion and the rearward end portion of the packing 32 sealing the gap between the conversion part 20 and the housing 13.

In this way, the rotary electric drive unit 1 is assembled such that the electrical equipment 5 is mounted on the case 2. As shown in FIG. 2, in the electrical connection structure of the present embodiment applied to the rotary electric drive unit 1, a virtual line 33 passing through the centers of the first three-phase terminal 15 and the second three-phase terminal 17 arranged in series is a straight line along the forward-rearward direction and extending horizontally. As shown in FIG. 2, a virtual line 34 connecting the center of the rotation shaft 6 of the first electric motor 3 and the center of the rotation shaft 7 of the second electric motor 4 is inclined with respect to the virtual line 33. That is, the virtual line 33 is not parallel to the virtual line 34.

As shown in FIG. 2, in the electrical connection structure of the present embodiment, as described above, the first three-phase terminal 15 and the second three-phase terminal 17 are arranged in series, and the first electric motor side three-phase terminal 24 and the second electric motor side three-phase terminal 25 are arranged in parallel. Accordingly, the length of the electric motor side coupling member 19 in the forward-rearward direction is shorter than the length of the electrical equipment side coupling member 18 in the forward-rearward direction which is a direction in which the first three-phase terminal 15 and the second three-phase terminal 17 are arranged.

In the case of the electrical connection structure of the present embodiment, the first three-phase terminal 15 and the second three-phase terminal 17 are arranged in series in the forward end portion of the lower end portion of the housing 13, and the first electric motor side three-phase terminal 24 and the second electric motor side three-phase terminal 25 are arranged in parallel in the forward end portion of the upper end portion of the case 2. Therefore, according to the electrical connection structure of the present embodiment, as compared with the conventional case in which the first three-phase terminal and the second three-phase terminal are arranged in series, and the first electric motor side three-phase terminal and the second electric motor side three-phase terminal are arranged in series, it is possible to suppress the case 2 from protruding forward and realize the rotary electric drive unit 1 having a compact configuration.

In the case of the electrical connection structure of the present embodiment, the virtual line 33 is not parallel to the virtual line 34. Therefore, according to the electrical connection structure of the present embodiment, the first electric motor side three-phase terminal 24 and the second electric motor side three-phase terminal 25 can be arranged in parallel in the space in front of the first electric motor 3 and above the second electric motor 4. That is, the first electric motor side three-phase terminal 24 and the second electric motor side three-phase terminal 25 can be arranged in parallel in the space generated when the first electric motor 3 and the second electric motor 4 are arranged in the case 2.

In the case of the electrical connection structure of the present embodiment, the length of the electric motor side coupling member 19 in the forward-rearward direction is shorter than the length of the electrical equipment side coupling member 18 in the forward-rearward direction. Therefore, the opening 28 of the case 2 can be made small, and the rigidity and the noise and vibration (NV) performance can be improved.

Further, in the case of the electrical connection structure of the present embodiment, the electrical equipment side coupling member 18 is provided in the housing 13, and the conversion part 20 and the electric motor side coupling member 19 are provided in the case 2. A floating mechanism is provided between the electrical equipment side coupling member 18 and the first three-phase terminal 15 and the second three-phase terminal 17. Accordingly, structures requiring space can be distributed to the housing 13 and the case 2, making efficient use of available space.

The present invention is not limited to the above-described embodiment, and modifications and improvements within a range where the object of the present invention can be achieved are included in the present invention.

For example, the configuration of the connecting member 16 is not limited to the above-described embodiment. That is, it is only required that the first three-phase terminal and the second three-phase terminal arranged in series are electrically connected to the first electric motor side three-phase terminal and the second electric motor side three-phase terminal arranged in parallel.

EXPLANATION OF REFERENCE NUMERALS

2: case
3: first electric motor
4: second electric motor
5: electrical equipment
6: rotation shaft
7: rotation shaft
15: first three-phase terminal
16: connecting member
17: second three-phase terminal
18: electrical equipment side coupling member
19: electric motor side coupling member
20: conversion part
24: first electric motor side three-phase terminal
25: second electric motor side three-phase terminal
33: virtual line
34: virtual line

What is claimed is:

1. An electrical connection structure, comprising:
a case in which a first electric motor and a second electric motor are housed; and
electrical equipment that controls the first electric motor or the second electric motor,
wherein the first electric motor is electrically connected to a first three-phase terminal of the electrical equipment via a connecting member, and the second electric motor is electrically connected to a second three-phase terminal of the electrical equipment via the connecting member,
wherein on a side of the electrical equipment, the first three-phase terminal and the second three-phase terminal are arranged in series, and
wherein on a side of the case, a first electric motor side three-phase terminal in the connecting member, the first electric motor side three-phase terminal being connected to the first electric motor, and a second electric motor side three-phase terminal in the connecting member, the second electric motor side three-phase terminal being connected to the second electric motor, are arranged in parallel in an upper-lower direction.

2. The electrical connection structure according to claim 1,
wherein on the side of the electrical equipment, the first three-phase terminal and the second three-phase terminal are arranged in series in a row, and
wherein the first electric motor side three-phase terminal is arranged in series in a row and the second electric motor side three-phase terminal is arranged in series in a row, and
wherein on the side of the case, the first electric motor side three-phase terminal arranged in series and the second electric motor side three-phase terminal arranged in series are arranged in parallel in the upper-lower direction.

3. The electrical connection structure according to claim 1, wherein the first electric motor side three-phase terminal and the second electric motor side three-phase terminal are arranged in positions overlapping the second electric motor in the upper-lower direction.

* * * * *